(12) United States Patent
Wang et al.

(10) Patent No.: US 8,383,952 B2
(45) Date of Patent: Feb. 26, 2013

(54) PRINTED COMPATIBLE DESIGNS AND LAYOUT SCHEMES FOR PRINTED ELECTRONICS

(75) Inventors: Zhigang Wang, Sunnyvale, CA (US); Vivek Subramanian, Orinda, CA (US); Lee Cleveland, Santa Clara, CA (US)

(73) Assignee: Kovio, Inc., San Jose, CA (US)

( * ) Notice: Subject to any disclaimer, the term of this patent is extended or adjusted under 35 U.S.C. 154(b) by 213 days.

(21) Appl. No.: 12/851,014

(22) Filed: Aug. 5, 2010

(65) Prior Publication Data
US 2011/0186333 A1    Aug. 4, 2011

Related U.S. Application Data

(60) Provisional application No. 61/231,643, filed on Aug. 5, 2009, provisional application No. 61/255,804, filed on Oct. 28, 2009.

(51) Int. Cl.
*H05K 1/00* (2006.01)
*H05K 3/12* (2006.01)
*G06F 17/50* (2006.01)

(52) U.S. Cl. ........ 174/261; 174/250; 174/255; 174/262; 361/772; 361/774; 361/777; 361/778; 438/478; 438/614; 438/622; 716/116; 716/119; 29/846

(58) Field of Classification Search .......... 174/250–267; 361/760–777, 783–795; 716/111–122, 55, 716/126, 52, 139, 135, 123, 8–15; 438/149, 438/111, 736, 150, 619, 622, 99, 478, 208; 333/246; 257/57, 200, 723, 692, 59, 511, 257/512, 49; 29/825–852
See application file for complete search history.

(56) References Cited

U.S. PATENT DOCUMENTS

| | | | | | |
|---|---|---|---|---|---|
| 5,764,488 | A | * | 6/1998 | Silva et al. | 361/777 |
| 5,805,428 | A | * | 9/1998 | Singer | 361/777 |
| 6,143,355 | A | * | 11/2000 | Walsh et al. | 427/8 |
| 6,238,824 | B1 | * | 5/2001 | Futrell et al. | 430/5 |
| 6,317,864 | B1 | * | 11/2001 | Kikuchi et al. | 716/122 |
| 7,013,444 | B2 | * | 3/2006 | Igarashi et al. | 438/622 |
| 7,432,126 | B2 | * | 10/2008 | Schmid | 438/99 |
| 7,509,615 | B2 | * | 3/2009 | Hung et al. | 716/55 |
| 7,615,706 | B2 | * | 11/2009 | Chen et al. | 174/260 |
| 7,737,006 | B2 | * | 6/2010 | Colfer et al. | 438/478 |
| 7,765,507 | B2 | * | 7/2010 | Matsuoka | 716/112 |
| 2004/0111682 | A1 | | 6/2004 | Gopalakrishnan et al. | |
| 2004/0199892 | A1 | * | 10/2004 | Igarashi et al. | 716/12 |

(Continued)

OTHER PUBLICATIONS

International Search Report and Written Opinion; International Application No. PCT/US2010/044598; Dated Oct. 7, 2010; 7 pages; International Searching Authority / United States; Commissioner of Patents; Alexandria, Virginia.
International Preliminary Report on Patentability; International Application No. PCT/US2010/044598; Dated Feb. 7, 2012; 6 pages; The International Bureau of WIPO, Geneva, Switzerland.

*Primary Examiner* — Michail V Datskovskiy
(74) *Attorney, Agent, or Firm* — The Law Offices of Andrew D. Fortney; Andrew D. Fortney (57) ABSTRACT

Embodiments of the present invention relate to circuit layouts that are compatible with printing electronic inks, printed circuits formed by printing an electronic ink or a combination of printing and conventional blanket deposition and photolithography, and methods of forming circuits by printing electronic inks onto structures having print-compatible shapes. The layouts include features having (i) a print-compatible shape and (ii) an orientation that is either orthogonal or parallel to the orientation of every other feature in the layout.

26 Claims, 4 Drawing Sheets

U.S. PATENT DOCUMENTS

| | | |
|---|---|---|
| 2004/0221255 A1 | 11/2004 | Pierrat et al. |
| 2004/0223310 A1* | 11/2004 | Toyomura ..................... 361/777 |
| 2005/0022149 A1 | 1/2005 | Smith et al. |
| 2006/0159899 A1* | 7/2006 | Edwards et al. .............. 428/209 |
| 2008/0072204 A1* | 3/2008 | Chen ............................... 716/15 |
| 2008/0084449 A1* | 4/2008 | Cai et al. ......................... 347/20 |
| 2008/0160265 A1* | 7/2008 | Hieslmair et al. ............. 428/208 |
| 2008/0245556 A1 | 10/2008 | Bird et al. |

* cited by examiner

PRINTED COMPATIBLE DESIGNS AND LAYOUT SCHEMES FOR PRINTED ELECTRONICS

RELATED APPLICATIONS

This application claims the benefit of U.S. Provisional Patent Application Nos. 61/231,643, filed Aug. 5, 2009, and 61/255,804, filed Oct. 28, 2009, each of which is incorporated by reference herein in its entirety.

FIELD OF THE INVENTION

The present invention generally relates to layouts for printed electronics, printed circuits incorporating or based on these layouts, and methods of using these layouts to form structures in a circuit. The printed circuits may include printed semiconductor, conductor, and/or dielectric structures alone or in combination with conventionally formed structures. The methods used to form the printed circuits include printing semiconductor, conductor, dielectric, and/or dopant inks on various substrates and/or structures in a pattern corresponding to such layouts.

BACKGROUND

Printed electronic circuits have certain manufacturing issues that are not necessarily similar to conventional circuit photolithographically defined circuits. First, printing techniques may have relatively poor layer to layer registration, resulting in relatively large overlay allowances. Second, printing techniques generally have lower resolution than photolithography, and some printing techniques may have asymmetric resolution limits (i.e., resolution along one dimension differs from resolution along a different dimension). Third, printing techniques often exhibit proximity and shape-related effects such as wicking, merging of nearby/adjacent patterns, etc., that result in non-ideal pattern generation.

In various printing processes, liquid inks may be selectively deposited (e.g., printed) using a technique such as inkjet printing, gravure printing, screen printing, flexographic printing, etc. Printed electronics offer the potential to reduce the processing cost of conventional semiconductor and/or integrated circuit manufacturing, generally by using additive deposition of electronic inks (e.g., an ink containing one or more precursor[s] for forming a doped or undoped semiconductive, conductive, or dielectric structure or film) to produce electronic features (e.g., electrically functional or insulative structures or films). This approach to forming printed structures may be cost effective due to (i) the efficient usage of the precursor materials and (ii) the combination of deposition and patterning into one printing step. The use of doped or undoped conductive, semiconductive, and dielectric inks to form electrical structures may reduce or minimize the number of masking, photolithography, and etching steps in fabricating integrated circuits and/or structures therein.

Therefore, there is significant motivation within the integrated circuit and display manufacturing industries to develop methods of forming electronic devices using ink technologies. However, printing such electronic inks presents special issues because of the potential of liquids to show dynamic spreading on surfaces. Such spreading may be associated with the wetting and evaporation characteristics of the ink(s). Also, the inks can exhibit proximity and shape-related effects such as merging of nearby or adjacent patterns, which can result in significant and sometimes fatal deviations from the intended pattern.

Generally, the resolution, layer-to-layer registration, and pattern fidelity (in terms of sharpness of corners, line-edge roughness, etc.) of structures formed by printing methods are inferior to that of conventional optical photolithographic techniques. However, printing offers desirable benefits, such as cost efficiency and smooth (e.g., dome-shaped) structure profiles that allow for smooth transitions between layers in a circuit (e.g., without encountering sharp steps and providing more complete and/or uniform step coverage of subsequently deposited structures). Printing techniques sometimes suffer from degraded resolution as well as asymmetric resolution limits (e.g., the resolution in one direction [e.g., the x-axis] may be different from the resolution in another direction [e.g., the y-axis]).

In addition, pattern fidelity may also be an issue with printed circuit features. For example, in conventional optical lithography, laying out shapes as irregular polygons is not particularly problematic. However, such shapes are not particularly suited for printing techniques, due to wetting and wicking effects of the ink.

Figure 1:
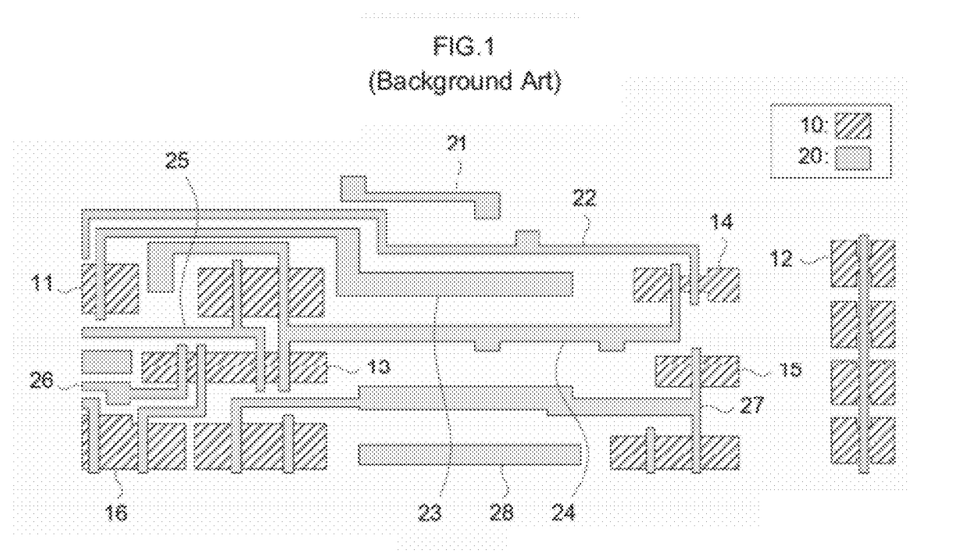
FIG. 1 shows a top-down view of a conventional layout with patterns having polygonal and/or irregular shapes.

FIG. 1 shows a conventional layout approach in which each of a first layout 10 for semiconductor islands 11-16 and a second layout 20 for gates 21-29 include irregular shapes (e.g., 12, 14, 16 and 22-27). This is the general approach and/or practice for Application Specific Integrated Circuit (ASIC) designs using traditional photolithographic processes. Printing of electronic inks using these conventional layouts can be difficult, because features generally cannot be printed at the minimum dimensions achievable by photolithography, and inks printed in an irregular geometry and/or on a non-planar or non-uniform surface may be adversely affected by liquid-phase physical phenomena (e.g., deviations from the ideal/target pattern due to spreading, wicking along an underlying topography or surface energy, beading due to surface tension effects, etc.).

SUMMARY OF THE INVENTION

Embodiments of the present invention relate to layouts for printed electronic circuits, printed circuit structures made using or in accordance with such layouts, and combinations of (photo)lithographically defined and printed electronic structures, circuits incorporating such layouts and printed structures, and methods of using such layouts to form circuits formed by printing semiconductor, conductor, dielectric, and/ or dopant structures on one of many possible substrates. More specifically, embodiments of the present invention pertain to layouts that are compatible with printing electronic ink compositions (e.g., comprising one or more precursors of a conductor, dielectric, or doped or undoped semiconductor). Because electronic inks printed on a substrate tend to deviate from the predetermined printed pattern through a number of different phenomena (e.g., spreading [wetting] and de-wetting behaviors, wicking, print misalignment, pattern proximity effects, edge and corner effects, inconsistencies in film topography/morphology, etc.), the present layouts provide patterns that generally provide greater inter-feature spacing and greater areas for forming features from an electronic ink printed onto a substrate.

In printed electronics applications, the level of control of feature dimensions (e.g., line width, thickness, etc.) and placement accuracy can differ significantly among printing methods. The layouts can be designed such that the pattern pitch and spacing compensate for the behavior and/or tendencies of printed electronic inks (e.g., spreading [wetting] and de-wetting [high surface tension] behaviors, wicking, pattern proximity effects, edge and corner effects, inconsistencies in film topography/morphology, etc.). Thus, the present layouts, and circuits and methods of forming circuitry that incorporate or are based on such layouts, may be used to improve the performance and yield of manufacturing processes that include printing one or more inks in a pattern. The layouts may incorporate patterns that have print-compatible shapes (e.g., stripes, rectangles, ovals, circles, etc.) and configurations or arrangements along a preferred orientation. This is unnecessary in conventional photolithographic processes, but in printed circuits, such shape and orientation selection allows for the realization of robust printed structures having relatively reproducible properties. For example, in ink jet printing (e.g., of an ink containing a semiconductor or metal precursor such as a polysilane or Ag) or screen printing (e.g., of a dielectric precursor containing an N-type or P-type dopant source), print-compatible shapes include lines, squares, rectangles, circles, and ovals. For gravure printing, print-compatible shapes include rectangles, squares and lines (see, e.g., FIG. 2).

In some embodiments, the present circuit layouts (e.g., a layout from which a circuit or circuit element can be formed) include (photo)lithographically defined lines and/or other structures (e.g., pads) over which the electronic ink may be printed in a predetermined pattern (e.g., the layout for the printed structure or ink). The circuit layouts may comprise multiple layers of patterns defining the shapes of structures within each layer. For example, the circuit layout may comprise a first pattern defining a layer of structures such as parallel semiconductor islands (e.g., which may have a linear structure or shape), and one or more patterns defining a corresponding number of functional layers over the first layer. The first layer of structures may include one or more lines (such as a series of repeated parallel vertical and/or horizontal lines islands with predetermining spacing[s] therebetween) and/or pads (e.g., rectangular, square, trapezoidal, oval, circular, etc.). The layer(s) formed over the first layer may comprise structures in circuit elements (e.g., thin film transistors, capacitors, diodes, interconnects, etc.), separated from each other along the structures of the first layer by a predetermined distance.

Points along structures (e.g., [photo]lithographically defined lines and/or pads) over which the electronic ink is deposited are selected in order to provide adequate spacing for the features to be subsequently formed by depositing an electronic ink in a predetermined pattern (e.g., printing). Individual lines and other circuit structures may be spaced by essentially any inter-line/inter-structure spacing that can accommodate the wetting of electronic inks printed thereover, without unwanted overlap or shorting of adjacent and/or nearby printed structures.

The layouts may be used in methods of forming or printing a circuit that include printing an ink composition, such as a semiconductor, dielectric or conductor ink, in a pre-determined pattern (e.g., comprising lines, squares, rectangles, circles, ovals, etc.) over a preformed pattern on a substrate. The pre-formed pattern may include a first layer of structures (e.g., lines and/or pads) that can be formed by either printing or conventional deposition (e.g., chemical vapor deposition [CVD], physical vapor deposition [PVD], etc.), photolithography, and etching techniques. The additional layer(s) may be formed by conventional lithographic techniques and/or printing an electronic ink, but generally, at least one additional layer is formed by printing an electronic ink. These additional layer(s) may comprise structures in circuit elements (e.g., thin film transistors, capacitors, diodes, interconnects, etc.) that are formed over the first layer of structures. In other applications, a dopant ink (e.g., a dielectric ink comprising a P-type or N-type dopant), a dielectric ink, or a metal ink (e.g., for forming a silicide) may be printed over a preformed pattern of semiconductor (e.g., silicon, germanium, etc.) lines, pads, and/or islands in the first layer of structures. The electronic ink(s) deposited over the substrate and/or the first layer of structures are then processed. For instance, in the case of a dopant ink deposited over silicon structures, the pattern of silicon structures with the dopant ink thereon may be heated after deposition of the dopant ink to drive the dopant into the silicon structures.

A first aspect of the present invention concerns a layout for a printed circuit comprising a first layout of circuit features, the first layout of circuit features including a first plurality of features corresponding to a first set of printed structures in a circuit, each of the first plurality of features independently being a print-compatible shape having an orientation that is either orthogonal or parallel to the orientation of every other feature in the first plurality of features; and a second layout of circuit features having a second plurality of features each corresponding to a second set of printed structures in a circuit, each of the second plurality of features independently being print-compatible shape having an orientation that is either orthogonal or parallel to the orientation of every other feature in the second plurality of features and to the orientation of every feature in the first plurality of features. Each of the first and second pluralities of features may have one or more subsets, and the one or more subsets of the second plurality of features may overlap one or more subsets of the first plurality of features, respectively. For example, the first plurality of features may include a plurality of parallel semiconductor islands, each of which may be considered a subset of the first plurality of features, and each of the subsets of the second plurality of features may include multiple circuit elements having print-compatible shapes that overlap with the semiconductor islands. A first subset of the second plurality of features may overlap of the first plurality of features (e.g., a first semiconductor island), a second subset of the second plurality of features may overlap with another of the first plurality of features (e.g., a second semiconductor island), and so on. The print compatible geometries and/or patterns (e.g., lines, squares, rectangles, circles, and ovals, etc.) may be individually the same or different, as described herein.

In a second aspect, the invention relates to a circuit printed on a substrate, including a first printed layer consisting essentially of a first plurality of circuit structures each having a print-compatible shape having an orientation that is either orthogonal or parallel to the length and width of every other structure in the first plurality of structures; and a second printed layer having a second plurality of structures each having a shape consisting essentially of a print-compatible shape having an orientation that is either orthogonal or parallel to the length and width of every other structure in the second plurality of structures and to the length and width of every structure in the first plurality of structures. As described above with regard to the layouts, each of the first plurality of structures may have first and second subsets, and one or more subsets of the second plurality of features may overlap one or more subsets of the first plurality of features, respectively. The first plurality of features may include semiconductor islands, lines, pads, or other structures over which the second plurality of features are located. The second plurality of features may include structures in circuit elements (e.g., capacitors, diodes, transistors, and floating gate cells) comprising at least one layer having a semiconductor material (including Group IVA element[s]) or a metal material, and having a smooth and/or dome-shaped profile (see, e.g., co-pending U.S. patent application Ser. No. 12/243,880, filed Oct. 1, 2008, incorporated by reference herein). The semiconductor material may comprise hydrogenated, dehydrogenated or non-hydrogenated amorphous, microcrystalline or polycrystalline silicon. The semiconductor material may also comprise germanium or a mixture of silicon and germanium. The metal material may comprise any metal appropriate for forming gates. Such metal gates can be formed by printing an ink comprising one or more metal precursors such as (organo)metallic compounds, (organo)metallic complexes, (organo)metallic clusters, metal nanoparticles, and combinations thereof onto the structures of the first plurality of features.

In a third embodiment, the invention relates to a method of printing layers in an integrated circuit, comprising printing a first layer having a first plurality of structures each having a shape in a layout view consisting essentially of a print-compatible shape having an orientation that is either orthogonal or parallel to the length and width of every other structure in the first plurality of structures, and printing a second layer having a second plurality of structures each having a shape in a layout view consisting essentially of the print-compatible shape having an orientation that is either orthogonal or parallel to the length and width of every other structure in the second plurality of structures and to the length and width of every structure in the first plurality of structures. The print-compatible shapes may have any one of a number of different geometries and patterns, as described herein. The printed electronic ink may comprise one or more electronic or insulative precursors (e.g., doped or undoped (poly)silanes, (poly)germanes, (poly)silagermanes, (cyclo)silanes, (cyclo)germanes, (cyclo)silagermanes, silicon and/or germanium nanoparticles, doped or undoped dielectric precursors, and/or metal salts, compounds, complexes, or nanoparticles) deposited in a predetermined, print-compatible pattern over a substrate. Alternatively, the first or second layer of circuit features may be formed by coating (e.g., spincoating, extrusion coating, CVD, PVD, etc.), photolithography, and isotropic and/or anisotropic etching techniques. Additionally, the first and second layers of circuit features may be printed over one or more conventionally formed (e.g., photolithographically-defined) circuit features.

Embodiments of the invention described herein provide improved layouts, electrical circuits incorporating or based on such layouts, and methods for printing electronic inks to form electrical circuits used in electronic devices. These circuits, layouts, and methods facilitate the development of electronics manufacturing using printable electronic inks, and reduce or avoid the use of relatively wasteful, expensive, hazardous, and/or time-consuming conventional techniques, such as blanket deposition, patterning, and/or etching processes. The electronic inks may be applicable to the manufacturing of thin film transistors, capacitors, diodes, interconnects, integrated circuits comprising the same, etc., on various substrates including, but not limited to, glass (e.g., quartz, liquid crystal display [LCD] glass) sheets, foils or slips, plastic and/or metal foils, sheets or slabs, silicon wafers, etc., all of which may further include one or more barrier and/or planarization layers (such as a polyimide or other polymer, silicon and/or aluminum oxide, etc.) thereon. Applications of electronic devices formed with the electronic inks described herein include but are not limited to displays, RF devices, sensors, volatile and nonvolatile memory, photovoltaic cells, identification and/or security tags, smart cards, etc. Further benefits and other advantages of the present invention will become readily apparent from the detailed description of the preferred embodiments.

DETAILED DESCRIPTION OF EXEMPLARY EMBODIMENTS

Reference will now be made in detail to various embodiments of the invention, examples of which are illustrated in the accompanying drawings. While the invention will be described in conjunction with exemplary embodiments, it will be understood that the description is not intended to limit the invention to these embodiments. On the contrary, the invention is intended to cover alternatives, modifications and equivalents that may be included within the spirit and scope of the invention as defined by the appended claims. Furthermore, in the following detailed description, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention. In addition, it should be understood that the possible permutations and combinations described herein are not meant to limit the invention. Specifically, disclosed variations that are not inconsistent with each other may be mixed and matched as desired.

For the sake of convenience and simplicity, the terms "coupled to," "connected to," and "in communication with" mean direct or indirect coupling, connection or communication, unless the context clearly indicates otherwise. These terms are generally used interchangeably herein, but are generally given their art-recognized meanings. Furthermore, the terms "shape," "feature," "line," "structure," and or other such terms may be used interchangeably, and use of one such term will generally include the other terms, although the meaning of the term should be taken from the context in which it is used. Also, for convenience and simplicity, the terms "part," "portion," and "region" may be used interchangeably, but these terms are also generally given their art-recognized meanings The term "(semi)conductor," "(semi)conductive," "(semi)conducting" and grammatical equivalents thereof refer to materials, precursors, layers, features or other species or structures that are conductive and/or semiconductive.

The term "silane" refers to compounds or mixtures of compounds that contain primarily or consist essentially of (1) silicon and/or germanium and (2) hydrogen, and the term "polysilane" refers to compounds or mixtures of compounds that predominantly contain species having at least 15 silicon and/or germanium atoms. The term "(poly)silane" refers to compounds or mixtures of compounds that are silanes, polysilanes or both. Such (poly)silane species (i.e., silane and/or polysilane) may contain one or more branches, cross-links, and/or cyclic rings, and/or an amount or atomic percentage of halogen atoms (such as Cl) and/or halogen-equivalents that does not have a significant adverse effect on the properties of a given composition for a particular application. The term "(cyclo)alkane" refers to compounds or mixtures of compounds that consist essentially of carbon and hydrogen, and that may be linear, branched, and/or cyclic. The term "(cyclo)silane" refers to compounds or mixtures of compounds that consist essentially of (1) silicon and/or germanium and (2) hydrogen, and that may contain one or more cyclic rings and less than 15 silicon and/or germanium atoms. The term "hetero(cyclo)silane" refers to compounds or mixtures of compounds that consist essentially of (1) silicon and/or germanium, (2) hydrogen, and (3) one or more dopant atoms such as B, P, As or Sb that may be substituted by a conventional hydrocarbon, silyl or germyl substituent and that may contain one or more cyclic rings. To further clarify, when parentheses are used in the present application to set off a prefix, suffix, or a plural form (e.g., an "s" or "es" at the end of a word), the parenthesized item is optional. For instance, (poly)silane may refer to silanes and/or polysilanes (as described above) in the present application. Also, a "major surface" of a structure or feature is a surface defined at least in part by the largest axis of the structure or feature (e.g., if the structure is round and has a radius greater than its thickness, the radial surface[s] is/are the major surface of the structure; however, where the structure is square, rectangular or oval, the major surface of the structure is typically a surface defined by the two largest axes, generally the length and width). In addition, the term "doped" refers to a material that is doped with a substantially controllable dose of a known dopant (e.g., lightly doped, heavily doped, or doped at any doping level in between).

In the present application, the term "deposit" (and grammatical variations thereof) is intended to encompass all forms of deposition, including blanket deposition (e.g., CVD and PVD), coating, and printing. In various embodiments, coating may comprise spin-coating, spray-coating, slit coating, extrusion coating, meniscus coating, dip coating, slide-bar coating, pump dispensing, syringe dispensing, and/or pen-coating. In other embodiments, printing may comprise ink-jetting, gravure printing, offset printing, flexographic printing, vapor jetting, laser forward transfer or local laser CVD, laser writing, screen printing, slit extruding, stenciling, stamping, microspotting and/or selective pen-coating. In general, "coating" refers to a process where the ink or other material is deposited on substantially the entire substrate, whereas "printing" generally refers to a process where the ink or other material is selectively deposited in a predetermined pattern. Also, unless indicated otherwise from the context of its use herein, the terms "known," "fixed," "given," "certain" and "predetermined" generally refer to a value, quantity, parameter, constraint, condition, state, process, procedure, method, practice, or combination thereof that is, in theory, variable, but is typically set in advance and not varied thereafter when in use.

The invention, in its various aspects, will be explained in greater detail below with regard to exemplary embodiments.

Exemplary Layouts

Figure 2:
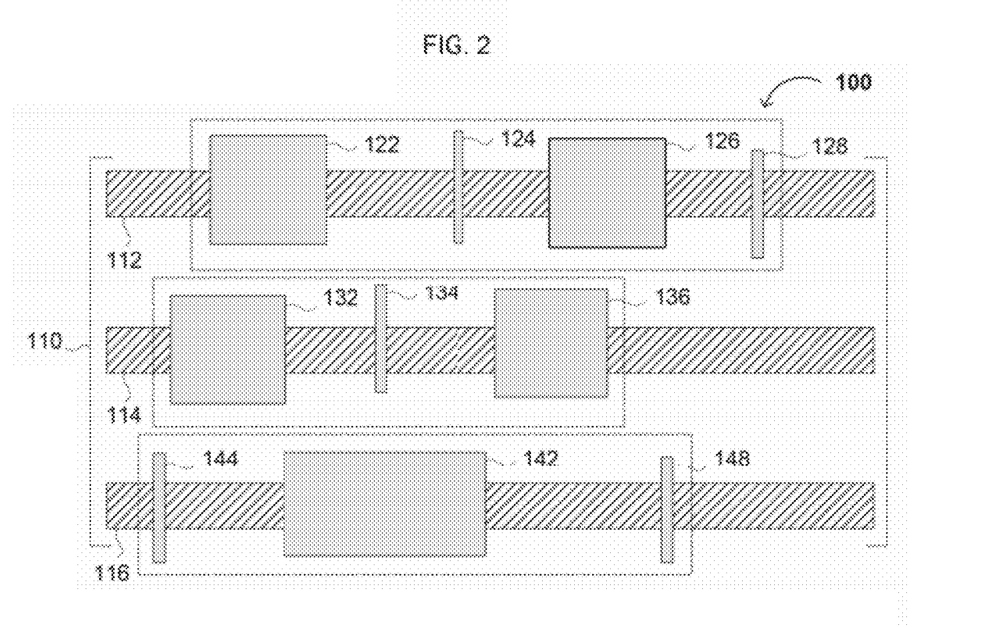
FIG. 2 shows a top-down view of an exemplary layout in accordance with one embodiment for printing electrical circuits as described herein.

The layouts of the present invention are intended to provide predetermined patterns of features (e.g., lines, islands, pads, plates, layers, or other structures in thin film transistors, capacitors, diodes, interconnects, etc.) in shapes and/or arrangements that are compatible with printing electronic inks (e.g., inks containing one or more conductor, dielectric, dopant, or doped and/or undoped semiconductor precursors). The layouts may be utilized in circuits formed by printing alone, or by a combination of conventional (photo)lithographic patterning and printing. Thus, the circuits formed using the present layouts may have a combination of conventionally-formed and printed electronic structures. In general, the patterns in the present layouts consist essentially of features that are aligned horizontally or vertically (as shown in FIG. 2), with print-compatible spacing between the features. This arrangement of features in the layout greatly facilitates printing structures that substantially conform to the layout pattern.

Referring to FIG. 2, the present layout 100 may include a first layer 110 including a number of features 112, 114, 116 in a predetermined pattern on a substrate. The pattern generally consists essentially of one or more print-compatible shapes, such as rectangles, lines, islands, pads, squares, circles or ovals (e.g., a series of [optionally repeated] vertical, horizontal, parallel, and/or perpendicular rectangles with predetermining spacing therebetween). The layout 100 also includes one or more groups 120, 130 140 of features having print-compatible shapes, printed in a predetermined pattern on or over each of the features 112, 114, and 116 in the first layer 110. The geometry and/or orientation of each print-compatible shape in the predetermined pattern of the second layer (including groups 120, 130 and 140) is generally vertical or horizontal, and/or parallel or perpendicular to each of the features in the second layer pattern and in the first layer pattern. The features in the first layer 110 may be defined by conventional photolithography and etching techniques, or alternatively, by printing techniques as described herein. However, the features in the second layer are defined by printing techniques. Thus, the structures in the first and second layers of the printed circuit corresponding to the features having print-compatible shapes may be formed by printing electronic inks, or a combination of printing an electronic ink and conventional deposition and patterning using blanket deposition, photolithography and etching. Naturally, the present layout approach can be applied to more than two layers of a circuit (e.g., three or more layers, four or more layers, etc.), but generally, at least one layer other than the lowest layer in such a layout approach is formed by patterning.

The features 112, 114, 116 of the first layer 110 may have any dimensions (e.g., lengths and widths, diameters, etc.) that can be achieved using either conventional deposition and patterning techniques or printing techniques using electronic inks For example, the features 112, 114, 116 may have a width in the range of from about 0.01 to about 1000 µm (e.g., 0.1 to 500 µm, 1 to 100 µm, or any other range of values therein) and a length in the range of from about 0.1 to about 10,000 µm (e.g., 1 to 5000 µm, 10 to 2000 µm, or any other range of values therein). For example, structures (e.g., semiconductor islands) in the first layer may have a length of from about 50 µm to about 1000 µm and a width of from about 10 µm to about 100 µm.

The print-compatible features of the present layout may have substantially constant dimensions (e.g., a rectangle, square, circle or line) or dimensions that vary as a function of the angle or arc from the minimum or maximum dimension from the center (e.g., an oval). For example, a feature having substantially constant dimensions may have a length, width and/or diameter that varies by an amount in the range of from about 0.001 to 100 µm (e.g., 0.1 to 50 µm, 1 to 25 µm, or any other range of values therein) or 0.1-50% (e.g., 0.5-20%, 1-10%, or any other range of values therein). The present layouts may include shapes having different sizes, different types (e.g., some shapes are rectangles, whereas other shapes are circles or squares, etc.), and each layout may have any number of features that fit within the defined layout area according to applicable design rules. In the present layouts, the feature widths and lengths, inter-feature spacings, and feature configurations (e.g., patterns, design rules, etc.) may vary, depending on the circuit design and/or the intended use of the circuit formed using the layout.

The individual features in layout 100 may be spaced at essentially any minimum distance that is compatible with resolution limits of the applicable method(s) for making the corresponding structures. The features of any printed layer are therefore generally spaced sufficiently to account for anticipated wetting (spreading) of an electronic ink printed over the features of the underlying layer. Thus, the spacing is generally sufficient to avoid ink printed in a first feature location from spreading and contacting ink printed in an adjacent feature location over the same or an adjacent first layer structure. Minimum spacing between adjacent first layer features 112, 114 and 116 may be at least about 1 µm (e.g., 5 µm, 10 µm, 20 µm, or any other value >1 µm). Minimum spacing between adjacent second layer features along a feature in the first layer (e.g., between features 122 and 124 over feature 112) may be the same as or greater than the minimum spacing between adjacent first layer features (e.g., at least about 1 µm, 5 µm, 10 µm, 20 µm, or any other value >1 µm), but minimum spacing between adjacent second layer features on or over adjacent first layer features (e.g., between features 122 and 132, respectively over features 112 and 114) may be less than the minimum spacing between adjacent first layer features (e.g., at least about 0.1 µm, 0.5 µm, 1 µm, 2 µm, or any other value >0.1 µm), depending on the wetting characteristics of the ink for forming the second layer, the topography and/or surface energy of the underlying first layer, etc.

In embodiments where the electronic inks are printed using inkjet printers, the printers generally have a printer grid with a minimum dimensional unit, such as a dot or pixel. The inter-feature spacing between the first layer structures should be at least one minimum dimensional unit (e.g., dot or pixel having a diameter of 1 to 500 µm) of a printing grid of an inkjet printer. In some embodiments, the inter-feature spacing is two or more minimum dimensional units of the printing apparatus.

In embodiments in which the first circuit layer includes conventional, photolithographically-defined rectangles or lines, the rectangles or lines may include one or more pads at the ends thereof for forming contacts and/or interconnects. The pads may have a width greater than the width of the rectangle or line to which it is attached. In such an embodiment, the pads may be staggered or offset from the adjacent rectangle or line (or pad at the end of the adjacent rectangle or line).

In the second layer (and any subsequently printed layer), the features correspond to printed electronic structures to be formed by printing an electronic ink composition, such as a doped or undoped semiconductor, dielectric, dopant or conductor ink, in a pre-determined pattern on or over an underlying layer, and then processing the printed ink by irradiating, heating, curing, and/or annealing the printed ink to form the printed electronic structure, as described herein. Printing may include inkjet, gravure, flexographic, offset or screen printing (further described herein). The electronic ink may be a dielectric ink, a dopant ink (e.g., a dielectric ink further comprising a P-type or N-type dopant), a doped or undoped semiconductor ink, or a metal ink.

Exemplary Methods of Forming Printed Circuit Structures

Figure 3A:
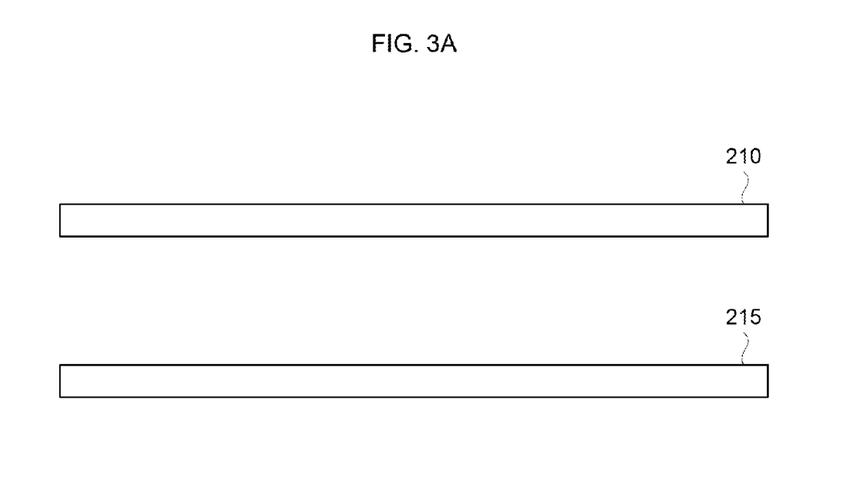
FIGS. 3A-3C show top-down views of exemplary layouts in accordance with another embodiment for printing electrical circuits as described herein.

FIG. 3A depicts a layout comprising parallel rectangles 210 and 215 in a first layer of an electronic circuit. In one embodiment, rectangles 210 and 215 represent semiconductor islands for MOS transistors to be formed on or over a substrate. The semiconductor islands to be formed from rectangles 210 and 215 may have a length in a range of about 1 to 10,000 µm (e.g., 25 to 5000 µm, 50 to 3000 µm, or any other range therein), and a width of from about 1 to 500 µm. Although FIG. 3A includes only two rectangles 210 and 215 in the first layer, embodiments of the invention are not limited to such arrangements. Embodiments of the present layout structures include one or more patterns, each having two or more parallel features (e.g., a first subset of features having two or more parallel rectangles and a second subset of features having two or more parallel rectangles orthogonal or perpendicular to the first subset of features).

The spacing between the adjacent rectangles 210 and 215 is from about 0.1 to 500 µm (e.g., 1 to 250 µm, 2 to 150 µm, or any other range of values therein) to accommodate circuit elements 220, 222, 224, 226, 230, 232, and 234 to be printed thereover. In general, the farther apart the features 210 and 215, the smaller the effect(s) of wicking along features 210 and 215 when an ink is printed thereon. For inkjet printing applications, the spacing may be as small as about 1 µm (e.g., 10 µm, 20 µm, 50 µm, 100 µm, or any other value of at least 10 µm) due to the current limitations of inkjet printers. However, the present invention is not limited to that range. For screen printing, flexographic printing, and other techniques, the minimum spacing may be about 1 µm, or any value of at least 1 µm. Such spacing is compatible with printing circular, oval, linear/rectangular, or other shapes from electronic inks.

The structures represented by rectangles 210 and 215 in the first layer may be formed by blanket deposition (e.g., a vacuum deposition method such as chemical vapor deposition [CVD], plasma-enhanced CVD, low-pressure CVD, atomic layer deposition [ALD], sputter deposition, evaporation, etc., or a coating method such as spray coating, dip coating, blade coating, meniscus coating, slit coating, extrusion coating, pen-coating, microspotting, spin-coating, etc.) to form a layer of electronic material. The layer of electronic material may then be patterned by conventional photolithography and etching (e.g., anisotropic [dry or plasma] etching and/or isotropic [wet] etching) to form a set of circuit structures (e.g., lines or islands) corresponding to rectangles 210 and 215.

However, the structures corresponding to the first layer of features 210 and 215 are preferably formed by printing an electronic ink on or over a substrate. Photolithographically defined circuit structures tend to have relatively sharp edges and corners, and substantially vertical sides. Deposition of electrically functional layers (either by blanket deposition or printing) over photolithographically defined structures may result in non-uniformities, discontinuities or gaps in the deposited layer. The shapes and profiles of structures formed by printing liquid inks can be controlled to a substantial degree by a combination of print process conditions.

In order to print an ink composition comprising precursors for an electrically active structure (e.g., a semiconductor, dielectric or conductor structure) in a print-compatible shape having dimensions as close as possible to those of the corresponding feature in the layout, the printed ink must be fixed or "pinned." Without a mechanism for pinning the liquid as the solvent evaporates, the liquid may retreat until it forms one or more spherical drops on the surface, or spread in a relatively uncontrolled manner, rather than form a structure having the print-compatible shape. Parameters such as ink viscosity, ink contact angle, solvent evaporation rate, precursor mass loading, precursor solubility, and substrate surface energy can be adjusted to achieve a printed structure that retains the shape in which it was printed and that has a dome-like and/or smooth, rounded cross-sectional profile after printing, drying, and/or curing. In many cases, the profile varies smoothly in both x and y (horizontal and vertical) dimensions, such that sharp transitions in the topology can be avoided (see, e.g., U.S. patent application Ser. Nos. 12/243,880, 12/114,741, respectively filed Oct. 1, 2008, May 2, 2008, and Aug. 21, 2007, the relevant portions of each of which are hereby incorporated by reference). This allows for significant device reliability advantages that cannot be achieved easily in a conventional photolithographically defined process.

For instance, if circuit elements, such as a gate or metal interconnect, is deposited (e.g., by printing an electronic ink) over a conventional, photolithographically patterned structure, a loss of charge due to leakage current may occur at locations where the overlying circuit element meets a sharp edge or corner of the conventionally formed structure. The leakage current can be avoided by forming structures having a smooth and/or dome-shaped geometry, as disclosed in the present application. Embodiments of the present invention include gate electrodes and other patterned features that do not cross over a sharp transition region or step, on or over channels (e.g., in the case of transistors) or other structures. In general, the profiles of the presently disclosed semiconductor, dielectric, and conductor structures allow for smooth transitions without encountering sharp steps, thereby preventing discontinuities in ink printed on or over such structures during the printing process, and allowing for more complete step coverage of subsequently printed structures.

The printing methods of the present invention include printing an electronic ink composition containing one or more electronic precursors in a predetermined pattern (e.g., a pattern comprising one or more print compatible shapes, such as a line, square, rectangle, circle, or oval) to form a corresponding number of features in a layer of a circuit (see, e.g., U.S. patent application Ser. No. 12/114,741, filed May 2, 2008). The structures in the present invention may also be formed by depositing or printing an ink composition comprising one or more dopants (e.g., N-type and/or P-type dopants) and/or one or more dielectric or semiconductor precursor(s) in a predetermined, print-compatible shape. The present electronic ink compositions may be deposited over the substrate using any suitable deposition technique known in the art. For example, the ink may be deposited by coating or printing as described herein. The method of printing the electronic ink composition as disclosed herein preferably comprises inkjet printing, gravure printing, screen printing, offset printing, flexography, syringe dispensing, microspotting, stenciling, stamping, pump dispensing, laser forward transfer, local laser CVD and/or pen-coating an ink composition containing an electronic material precursor onto the substrate, wherein only predetermined portions of the substrate (generally corresponding to a print compatible shape) are covered with the composition (see, e.g., U.S. patent application Ser. Nos. 11/888,949, 12/114,741, 12/243,880 and 12/509,351, filed Aug. 3, 2007, May 2, 2008, Oct. 1, 2008, and Jul. 24, 2009, respectively, the relevant portions of which are incorporated herein by reference).

The ink compositions used to form the circuit structures generally comprise (i) one or more dielectric, semiconductor, or conductor precursors, and (ii) a solvent in which the one or more electronic precursors are soluble. The dielectric, semiconductor, or conductor precursor(s) may be present in an amount of from about 1 to 99% (e.g., 1 to 40%, 5 to 25%, or any other range of values therein) by weight of the electronic ink composition. The electronic ink composition may further comprise one or more dopant sources, generally (but not exclusively) consisting essentially of one or more conventional semiconductor dopant atoms (e.g., B, P, As or Sb). The one or more dopant sources may be present in an amount from 0.00001 to about 30 wt. % (or any other range of values therein, such as 0.001 to 10 wt. %) of the composition. The dielectric, semiconductor, or conductor precursor(s) are typically present in an amount providing a viscosity of from about 2 to about 100,000 cP (e.g., from about 2 to about 100, from about 4 to about 50 cP, from about 4 to about 25 cP, or any other range of values therein). The composition may further comprise one or more conventional additives (e.g., in an amount from about 0.01 to 10 wt. %, in trace amounts, or any other range of values therein), such as a surface tension reducing agent, a wetting agent, a surfactant, a binding agent, a thickening agent, photoinitiator, etc. These additives may aid adjusting the viscosity, surface tension, wetting, and/or other characteristics of the ink to promote fixing or "pinning" of the ink to a substrate (see, e.g., U.S. patent application Ser. No. 12/114,741, filed May 2, 2008, the relevant portions of which are incorporated herein by reference). The amount of precursor(s) and other optional constituents in the electronic ink can be adjusted for compatibility with a chosen deposition method (e.g., inkjet printing, screen printing, etc.).

The electronic ink may be a semiconductor ink composition, containing one or more semiconductor precursor(s). In one embodiment, the semiconductor precursor(s) include a Group IVA element precursor (preferably of Si and/or Ge), such as a straight-chain, branched, cross-linked, cyclic or polycyclic (poly)silane, (poly)germane, (poly)germasilane or (poly)silagermane (hereinafter collectively referred to as "(poly)silanes"), and/or silicon and/or germanium nanoparticles (see, e.g., U.S. patent application Ser. No. 10/616,147 [filed on Jul. 8, 2003], Ser. No. 10/789,317 [filed on Feb. 27, 2004], Ser. No. 10/949,013 [filed on Sep. 24, 2004], Ser. No. 11/543,414 [filed on Oct. 5, 2006], Ser. No. 11/867,587 [filed on Oct. 4, 2007], and Ser. No. 12/114,741 [filed May 2, 2008], the relevant portions of which are incorporated herein by reference). Such precursors are useful for making amorphous hydrogenated, microcrystalline, and/or polycrystalline semiconductor films.

Alternatively, the present ink composition may be a conductive ink, comprising one or more metal precursors such as (organo)metallic compounds, complexes and/or clusters, one or more metal nanoparticles, and combinations thereof. For example, the (organo)metallic compounds, complexes, clusters and nanoparticles may include known compounds, complexes, clusters and/or nanoparticles of metals such as aluminum, titanium, zirconium, hafnium, vanadium, niobium, tantalum, chromium, molybdenum, tungsten, manganese, rhenium, iron, ruthenium, osmium, cobalt, rhodium, iridium, nickel, palladium, platinum, copper, silver, gold, zinc, cadmium, gallium, indium, thallium, tin, lead, and bismuth, preferably aluminum, titanium, hafnium, tantalum, molybdenum, tungsten, cobalt, nickel, palladium, platinum, copper, silver, and gold (see, e.g., U.S. Pat. No. 7,294,449 and U.S. patent application Ser. No. 12/114,741 [filed May 2, 2008], and Ser. No. 12/509,351 [filed Jul. 24, 2009], the relevant portions of which are hereby incorporated by reference).

The present ink compositions may comprise one or more dielectric precursors and/or a dopant (e.g., containing one or more n-type or p-type dopants) that may be useful for doping patterns of semiconductive structures (e.g., silicon lines or islands, etc.). The dielectric and/or dopant ink composition may comprise one or more dielectric precursors such as a molecular, organometallic, polymeric and/or nanoparticle source of silica, silicon nitride, silicon oxynitride, aluminate, titanate, titanosilicate, zirconia, hafnia, ceria, etc., that is capable of forming a (doped) dielectric film (see, e.g., U.S. patent application Ser. No. 12/114,741 [filed May 2, 2008], the relevant portions of which are incorporated herein by reference). For example, the dielectric precursor may comprise a silicate compound containing silicon and oxygen, and optionally one or more sources of dopant atoms, such as B-, P-, As- and/or Sb-containing compounds. Alternatively or additionally, the dielectric precursor may comprise a compound that forms a silicate dielectric upon polymerization or precipitation, such as a silsesquioxane, a siloxane, a silazane, an oxidized silane such as cyclo-(O—SiH$_2$)$_5$, etc. Alternatively, the dielectric precursor may comprise a source of other dielectrically effective materials, such as an oxidized germane, an aluminate source (e.g., a source of Al$_2$O$_3$, such as trimethoxyaluminum or triethoxyaluminum), a titanate source (e.g., a source of TiO$_2$, such as tetramethoxytitanium or tetraethoxytitanium), an aluminosilicate source, a titanosilicate source, a germanate source (e.g., a source of GeO$_2$, such as tetramethoxygermanium or tetraethoxygermanium), hafnia, zirconia, ceria, etc. Such precursors may contain organic substituents, such as alkyl, alkoxy, alkylamino, aryl and/or aryloxy groups, etc. Even further dielectric precursors include oxidizable precursors, such as silanes, germanes, germasilanes, or nanoparticles of silicon, germanium, metals such as aluminum, cerium, titanium, hafnium, zirconium, etc., and/or oxides, nitrides and/or oxynitrides of such elements and/or metals. Suitable silanes, germanes, and germasilanes (as well as methods of making the same) are described in U.S. patent application Ser. Nos. 10/616,147, 10/789,317, 10/949,013, and 11/867,587, filed on Jul. 8, 2003, Feb. 27, 2004, Sep. 24, 2004, and Oct. 4, 2007, respectively, the relevant portions of which are incorporated herein by reference.

The solvent in the present ink composition may be one that provides a relatively high degree of stability to the ink composition, provides an advantageous viscosity and volatility (e.g., sufficient to prevent printer nozzle clogging in the case of inkjet printing, allow the printed or coated ink to dry at relatively low temperatures and relatively short times, and/or that is generally easily and/or thoroughly removable from the composition; see, e.g., U.S. patent application Ser. No. 12/114,741 [filed May 2, 2008] and Ser. No. 12/509,351 [filed Jul. 24, 2009], the relevant portions of which are incorporated herein by reference). For example, the solvent preferably is one that is substantially completely removed by printing the ink onto a platen at a temperature of 30-90° C., followed by heating for 5 to 90 min. at a temperature of 30 to 200° C. (preferably at a temperature equal to or greater than that of the platen), optionally in a vacuum. The solvent may be present in an amount constituting 0 to 99% of the ink composition by weight (e.g., from 10 to 95%, 50 to 90%, or any other range of values therein). The solvent may alternatively be added in a volume or volume ratio sufficient to formulate an ink or paste suitable for screen printing (e.g., a paste having a viscosity in a range of about 10,000 cP to 100,000 cP) or to formulate an ink suitable for gravure printing (e.g., an ink having a viscosity of from about 20 cP to about 200 cP).

In general, an electrically functional or insulative layer may be formed by printing an electronic ink composition (e.g., comprising one or more, doped or undoped, semiconductor, conductor, or dielectric precursor(s), and a solvent or solvent mixture, and optionally, one or more other additives as described above) on a substrate or a pre-existing pattern of circuit structures having predetermined print-compatible shapes, and after the electronic ink is printed on or over the (preformed) structures, the printed electronic ink can be processed (e.g., irradiated, heated, cured, and/or annealed) to form printed structures in substantial conformance with the pattern in the layout. In various embodiments, the ink composition is simultaneously and/or subsequently irradiated (e.g., with visible light, UV, IR, and/or actinic radiation) and optionally heated during and/or after the printing process, thereby drying, oligomerizing, polymerizing and/or fixing or "pinning" the deposited ink composition on the substrate. The method may further comprise heating and/or curing the printed, irradiated ink to further polymerize the precursor(s) and/or form a patterned, electrically functional layer. Thus, the circuit structures having print compatible shapes can be made by depositing (e.g., printing or coating) an electronic ink composition, irradiating and/or heating the ink, and curing the ink to form structures on or over a substrate (itself comprising structures having print-compatible shapes) corresponding to the features in the layout.

The circuits described herein can be formed on any suitable substrate. The substrate generally comprises a mechanical support structure, which may be electrically inert or active, and which may include one or more predetermined physical, electrical and/or optical properties. Suitable electrically inert or inactive substrates may comprise a glass or other ceramic plate, disc, sheet or slip (e.g., comprising display-type glass, quartz, amorphous silicon dioxide, etc.), a dielectric and/or a plastic sheet or disc (e.g., a transparent plastic such as a polycarbonate sheet, polyimide or polyethylene sheets, etc.), laminated variations thereof, etc. Alternatively, suitable electrically conductive substrates may comprise a semiconductor wafer or disc (e.g., a silicon wafer), a metal disc, film, sheet, slab, or foil, etc. Any of the above-mentioned substrates may further include one or more buffer, passivation, planarization, mechanical support and/or insulating layers thereon. For example, the buffer, planarization and/or insulating layer may comprise a polyimide or other polymer layer or sheet, silicon dioxide and/or aluminum oxide, etc. Suitable substrates are described in detail in co-pending U.S. patent application Ser. No. 11/888,949 (filed Aug. 3, 2007), Ser. No. 12/114,741 (filed May 2, 2008), Ser. No. 12/243,880 (filed Oct. 1, 2008), and Ser. No. 12/509,351 (filed Jul. 24, 2009), the relevant portions of which are incorporated herein by reference. In further embodiments, the substrate can be treated with other compounds to adjust and improve the behavior of the ink composition on the substrate surface. The profile and dimensions of a circuit feature formed from an ink printed on the substrate may be controlled and improved by adjusting the surface energy of the substrate to optimize a contact angle (e.g., from 0° to 15°) between the substrate and the printed ink. Such contact angles can be used to fine tune the feature or line width (see, e.g., U.S. patent application Ser. No. 12/114, 741, filed May 2, 2008, the relevant portions of which are incorporated herein by reference).

Figure 3B:
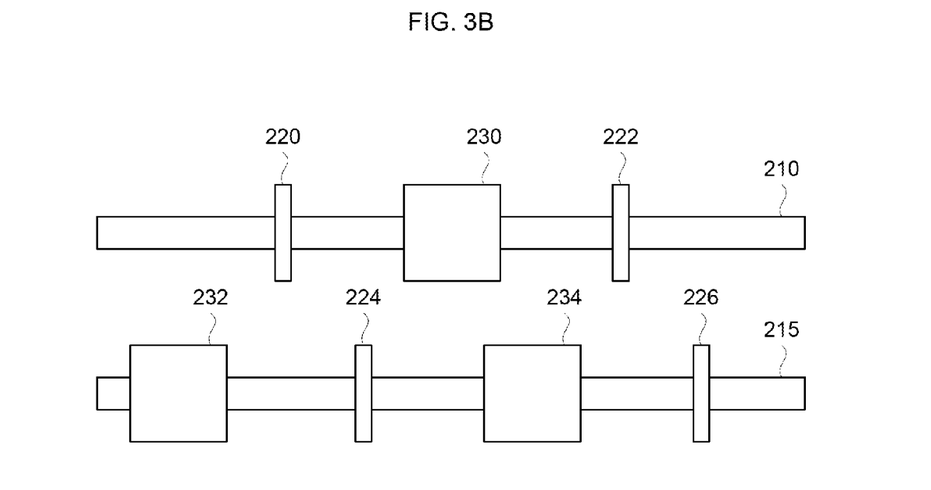

The layout of FIG. 3B shows a second layer comprising a first set of features 220, 222, 224 and 226 and a second set of features 230, 232 and 234. The individual features 220, 222, 224 and 226 of the first set of features are each formed at an orthogonal or parallel orientation to the feature 210 of the first layer. Similarly, the individual features 230, 232 and 234 of the second set of features are each formed at an orthogonal or parallel orientation to the feature 215 of the first layer. The features have shapes and dimensions that are compatible with electronic ink printing techniques. The length and width of the features in the second layer may be 1 to 10,000 µm (e.g., 5 to 5000 µm, 10 to 2500 µm, or any other range of values therein). In one example, the features 220, 222, 224 and 226 may correspond to a gate electrode structure, and have a width (e.g., the horizontal dimension shown in FIG. 3B) in the range of about 0.01 to 500 µm (e.g., 1 to 200 µm, 10 to 100 µm, or any other range of values therein), and a length (e.g., the vertical dimension shown in FIG. 3B) in the range of about 1 to 5000 µm (e.g., 10 to 2500 µm, 50 to 1000 µm, or any other range of values therein). In addition, the features 230, 232 and 234 may correspond to a structure providing an isolation function, in which the features 230, 232 and 234 have a width and/or length sufficient to enable portions of an underlying semiconductor structure (e.g., corresponding to rectangles 210 and 215) to remain substantially undoped, thereby isolating a region of the structure corresponding to rectangle 210 or 215 to one side of the feature 230, 232 or 234 from a region of the structure corresponding to rectangle 210 or 215 on the opposite side of the feature 230, 232 or 234. In such an embodiment, either the structures corresponding to the features 230, 232 and 234 are not electrically connected to any other conductive structure, or they are electrically connected to a potential that permanently turns off any possible transistor that might form in the underlying structure (e.g., corresponding to rectangle 210 or 215).

Spacing between features within a set of features in the second layer, as well as between structures in the first set of features and structures in the second set of features, must be print compatible, meaning that it must be adequate to prevent overlap between or shorting of printed structures during the process of forming a circuit by printing an electronic ink. The minimum spacing between adjacent second layer features (e.g., features 220 and 230) over adjacent first layer features (e.g., rectangles 210 and 215) may be from about 0.1 to 100 µm (e.g., 1 to 80 µm, 2 to 50 µm, or any other value of at least about 0.1 µm). In embodiments designed for structures formed by printing electronic inks using inkjet printers, the minimum inter-feature spacing is at least one or two minimum dimensional units (e.g., dots or pixels, each having a diameter, for example, of from 1 to 100 µm, and in one example, of about 30 µm).

Figure 3C:
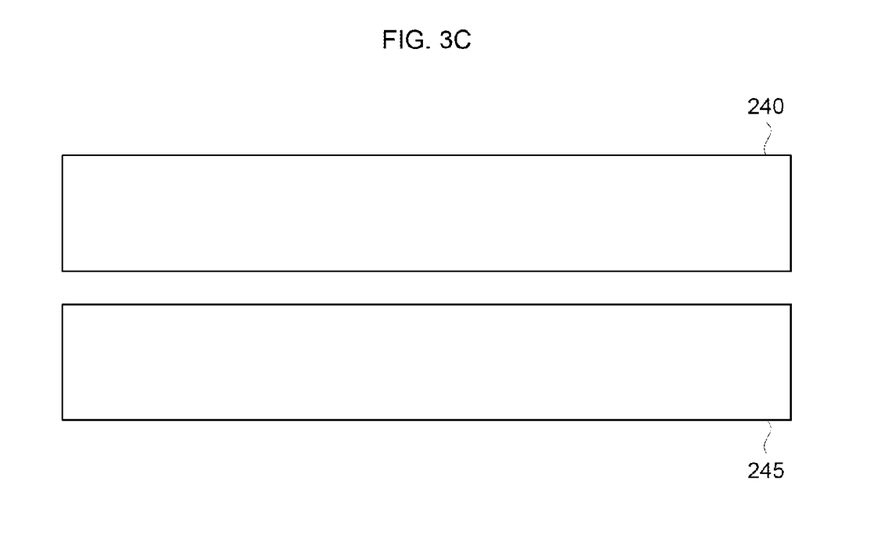

The layout shown in FIG. 3B, including the first and second layers of features, accommodates additional printed layers to be formed over the first and second layers of the circuit. Referring to FIG. 3C, the layouts may include one or more additional layers over the first and second layers, which additional layers are formed by electronic ink printing techniques as described herein. For example, FIG. 3C shows an embodiment of a third layout comprising first feature 240 and second feature 245 parallel thereto. Preferably, first feature 240 completely overlaps feature 210 of the first layout and features 220, 222 and 230 of the second layout, and second feature 245 completely overlaps second feature 215 of the first layout and features 224, 226, 232 and 234 of the second layout. In this embodiment, features 240 and 245 of the third layout correspond to first and second doped dielectrics, respectively. The first and second doped dielectrics may contain the same dopant, or different dopants having the same or different type and/or conductivity. Alternatively, the third layer may comprise an interlayer dielectric layer or other circuit layer (e.g., a metal layer for forming a metal silicide gate) formed over the first and second layers of FIG. 3B.

Figure 4:
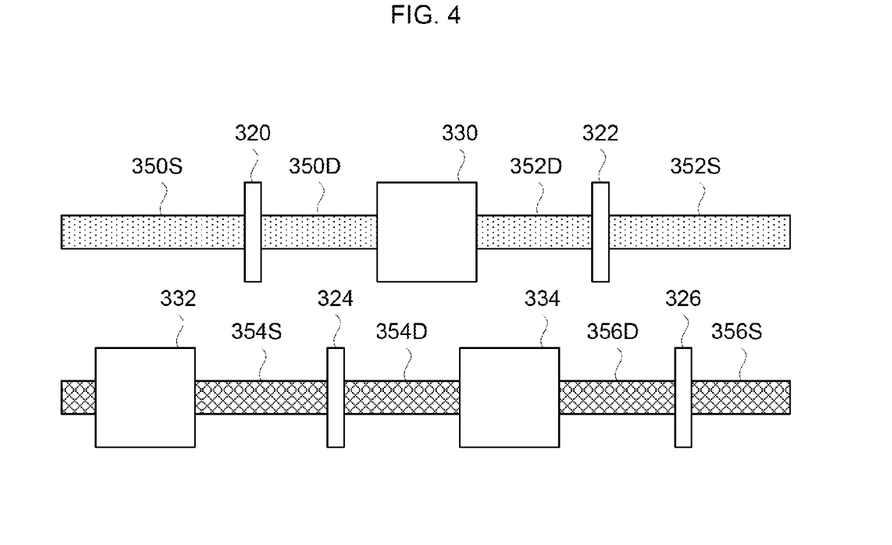
FIG. 4 shows a top-down view of an exemplary layout in accordance with an embodiment for making printed MOS thin-film transistors as described herein.

Referring to FIG. 4, after diffusion of the dopant from the doped dielectric(s) 240/245 into the underlying structures corresponding to the features 210 and 215 shown in FIGS. 3A-3B, the dopant is activated (e.g., by laser irradiation or thermal energy) to form various MOS transistors. For example, when the doped dielectric 240 has a first type of dopant (e.g., N-type) and the doped dielectric 245 has a second, complementary type of dopant (e.g., P-type), source/drain terminals 350S, 350D, 352S, and 352D having a first conductivity type and source/drain terminals 354S, 354D, 356S and 356D having a second conductivity type different from source/drain terminals 350S, 350D, 352S and 352D are formed. As shown in FIG. 4, four (4) thin film CMOS transistors are formed.

Exemplary Printed Circuits

The above description of a printed circuit includes a first layer of circuit structures that are formed on or over a substrate, and that may be formed by printing an electronic ink in a predetermined pattern over the substrate or by conventional deposition, photolithography and isotropic/anisotropic etching techniques. As explained above, the first layer of circuit structures may be in a predetermined pattern of print-compatible shapes, with predetermining spacing therebetween. The first layer of circuit structures may comprise semiconductor, conductor, and/or dielectric materials. In various embodiments, the first layer of circuit structures comprises a semiconductor layer (e.g., silicon, germanium, GaAs, ZnS, CdSe, SiC, metal oxides, etc.) or a conductive layer (e.g., a metal layer), on or over a substrate as described herein.

The structures in the first layer may have one or more print-compatible shapes, and the individual print-compatible shapes may be the same or different. The structures of the first circuit layer may comprise lines or rectangles of a semiconductor material, such as doped or undoped amorphous silicon (which may be hydrogenated), microcrystalline silicon, polysilicon, germanium, gallium arsenide, other compound semiconductors (such as InP, ZnS, CdSe, etc.), metal chalcogenide semiconductors (e.g., CdTe, CdSeTe, ZnSe, ZnS, etc.), or a combination thereof. Alternatively, the first circuit layer may comprise lines or rectangles comprising a conductive material. The conductive material may comprise aluminum, titanium, zirconium, hafnium, vanadium, niobium, tantalum, chromium, molybdenum, tungsten, manganese, rhenium, iron, ruthenium, osmium, cobalt, rhodium, iridium, nickel, palladium, platinum, copper, silver, gold, zinc, cadmium, gallium, indium, thallium, tin, lead, bismuth, or alloys or combinations thereof. In exemplary embodiments, the conductive material may comprise aluminum, titanium, hafnium, tantalum, molybdenum, tungsten, cobalt, nickel, palladium, platinum, copper, silver, gold, or alloys or combinations thereof. The first circuit layer may also comprise rectangles, squares, ovals or circles comprising a doped or undoped dielectric material (see examples of dielectric materials described elsewhere herein).

In exemplary embodiments, the circuits may be formed by printing an electronic ink on the substrate. This method of forming circuit structures results in a structure that may have relatively greater dimensions than a structure formed by conventional techniques (e.g., in the range of from 1 to 10,000 µm, 10 to 5000 µm, or any other range of values therein) and that has a dome-shaped cross-sectional profile (see, e.g., U.S. patent application Ser. No. 12/114,741 [filed May 2, 2008], Ser. No. 12/243,880 [filed Oct. 1, 2008], and Ser. No. 12/509, 351 [filed Jul. 24, 2009], the relevant portions of which are incorporated herein by reference). When the printed structure has a dome-shaped cross-sectional profile, it may also have rounded ends (and thus a substantially oval shape), even though the corresponding layout feature may have a rectangular shape.

The circuits of the present invention are not limited to 2 or 3 layers, and may include as many as 10, 12, or more layers, as is typical of integrated circuits. The examples given herein are limited to a small number of layers for the sake of simplicity and clarity. For example, a particular integrated circuit (IC) may include additional layers, such as a layer of parallel semiconductor lines/rectangles similar to the semiconductor island layer described above and suitable as structures in circuit elements (such as, e.g., capacitors, diodes, transistors, etc.); an interlayer insulating layer (e.g., comprising a spin-on dielectric, a printed dielectric, a dielectric deposited by CVD, etc.); and/or one or more alternating layers of parallel conductor lines/rectangles and interlayer insulating layers (generally having a plurality of contact holes therein exposing portions of the underlying [semi]conductive structures), similar to the conductor layer(s) and dielectric layer(s) described above and suitable as interconnect and/or contact structures in thin film circuits. Such additional layers may be formed by printing (as described herein) or by blanket deposition, photolithography, and etching. Structures formed over the circuit layers shown in FIGS. 3A-3C are generally connected to any (semi)conductor layers in FIGS. 3A-3C via conductive contacts through holes in an interlayer insulating layer.

Figure 5:
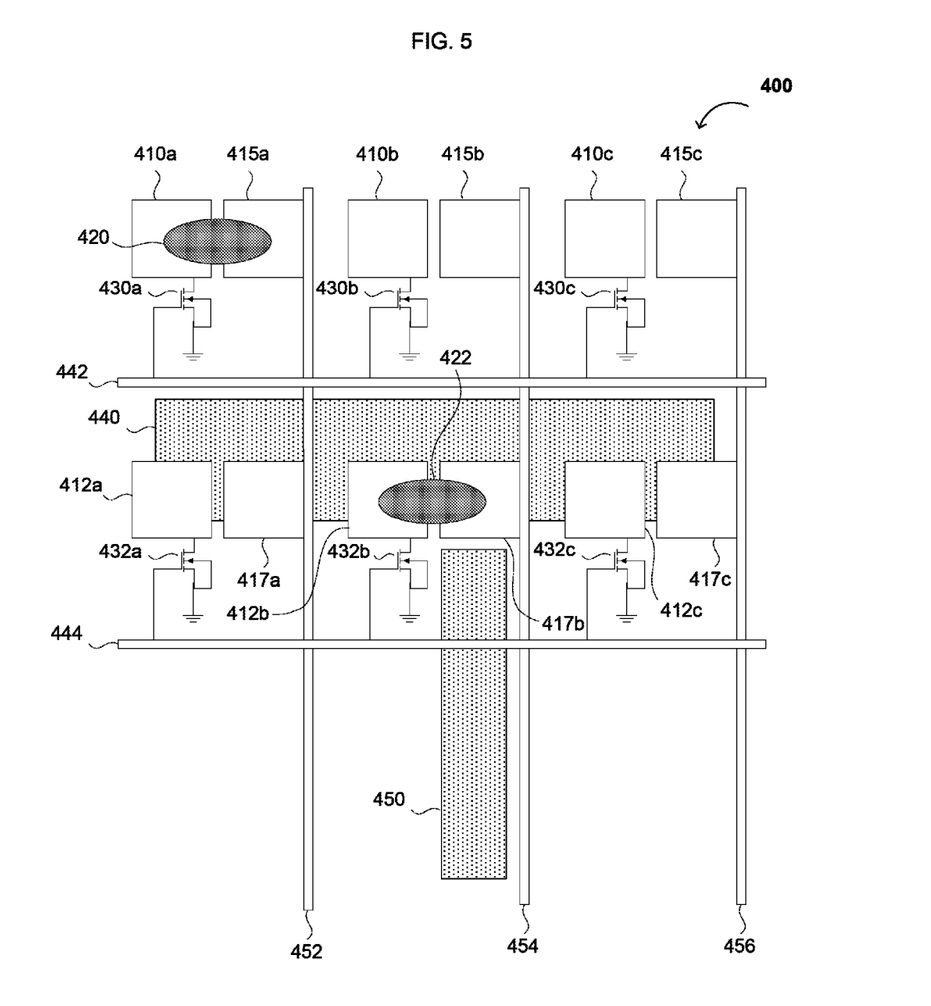
FIG. 5 shows a top-down view of an exemplary layout for programming ROM cells by printing a conductor layer in a pattern on a substrate having an uppermost layer of electrical structures having print-compatible shapes.

FIG. 5 shows a circuit design 400 for a read-only memory circuit (e.g., ROM) that incorporates both (photo)lithographically-defined structures and printed structures. This embodiment includes photolithographically-defined structures 410a-c, 415a-c, 412a-c, and 417a-c that represent conventionally formed pad structures and that have print-compatible shapes (e.g., a square). The 410a-c and 415a-c, and the structures 412a-c and 417a-c, are arranged in adjacent pairs (e.g., 410a and 415a). In an alternative embodiment, the structures 410a-c, 415a-c, 412a-c, and 417a-c may be printed structures having a different print compatible shape (e.g., a rectangle or circle). Pairs of adjacent structures (e.g., structures 410a and 415a) may be spaced apart from one another by a distance that electrically isolates the adjacent structures (e.g., from 0.01 to 100 µm, 0.1 to 50 µm, 1 to 20 µm, or any other range of values therein). In the embodiment of FIG. 5, the circuit 400 is designed so that electronic inks can be printed onto designated pairs of adjacent structures (e.g., structures 410a and 415a, or structures 432b and 437b) in order to form a structure 420, 422 that overlaps and thus electrically contacts both of the adjacent structures.

Given the registration and resolution limitations of printing, the pitch and size of a memory array layout is generally limited to structures large enough to accommodate resolution and registration limits for electronic ink printing techniques. Thus, adjacent structures 410a-c, 415a-c, 412a-c, and 417a-c must be sufficiently large to accommodate the entire area of a printed structure formed thereover and that electrically connects the adjacent structures. The structures 410a-c, 415a-c, 412a-c, and 417a-c may thus have a width and length in the range of about 0.1 to 500 µm (e.g., 1 to 250 µm, 15 to 150 µm, or any other range of values therein), or a diameter in such a range if the structures 410a-c, 415a-c, 412a-c, and 417a-c have a circular shape.

The circuit design/layout of FIG. 5 is compatible with a memory circuit in which a printed electronic ink is used to program the memory circuit. For example, FIG. 5 represents a pre-programmed memory array, in which programming is accomplished by selectively printing an electronic ink over adjacent pairs of structures. For example, a silver ink is selectively printed in locations 420 and 422 to short an open circuit defined by structures 410a-415a and 412b-417b in FIG. 5. The electronic structure 420 electrically connects the adjacent structures 410a and 415a, which together with transistor 430a (which may be formed by photolithography and etching), word line 442 and bit line 452 (each of which may be formed by either [i] photolithography and etching or [ii] printing), represent a bit to be programmed (e.g., to a binary "0" state), while leaving unprogrammed bits (e.g., adjacent structures 410b and 415b) unaltered (e.g., in binary "1" state) with no printed structure thereover.

The sizes of the structures in the memory array 400 may result in significant available space in embodiments that include relatively high resolution circuit structures and cells (e.g., transistors 430a-c and 432a-c) underneath programmable structures 410a-c, 415a-c, 412a-c, and 417a-c. By using the space between the higher resolution circuitry to house other circuitry, such as row driver circuitry block 440, bit line sense circuitry block 450, and the row and column decoders, space can be saved while continuing to enable the use of low-resolution printing to program the memory. Thus, in some embodiments, the circuit design may include a plurality of layers having print-compatible shapes and one or more conventional layers (e.g., having shapes defined by photolithography and/or computer-aided design software). Similarly, the present method may comprise printing a plurality of layers having print-compatible shapes, and forming one or more additional layers by conventional processing (e.g., photolithographic patterning, development and etching).

Exemplary Software, Computer-Readable Media and Electronic Representations

The present invention also includes algorithms, computer program(s) and/or software, implementable and/or executable in a general purpose computer or workstation equipped with a conventional digital signal processor, configured to design one or more structural layers in a circuit. Thus, a further aspect of the invention relates to methods and software for placing structures in a circuit layout. For example, the invention may further relate to a computer program or computer-readable medium containing a set of instructions which, when executed by an appropriate processing device (e.g., a signal processing device, such as a microcontroller, microprocessor or DSP device), is configured to generate a layout in accordance with the above description.

For example, the instructions may include one or more instructions to place a first plurality of features corresponding to a set of first structures in a first layer of the circuit, each of the first plurality of features independently consisting essentially of a first print-compatible shape having an orientation that is either orthogonal or parallel to the orientation of every other feature in the first plurality of features, generally according to a set of design rules (e.g., including rules for minimum width, minimum and/or maximum length, minimum inter-feature spacing, thickness, cross-sectional curvature or contact angle, minimum grid dimension of the printer, etc.). In some embodiments, the first layer consists of features corresponding to printed structures. The instructions may further include one or more instructions to place a second plurality of features corresponding to a set of printed structures in a second layer of the printed circuit, each of the second plurality of features independently consisting essentially of a second print-compatible shape having an orientation that is either orthogonal or parallel to the orientation of every other feature in the second plurality of features and to the orientation of every feature in the first plurality of features. The second plurality of features are generally placed according to a set of design rules that generally describe the same parameters (minimum and/or maximum dimensions for the structures, minimum inter-feature spacing, etc.), but that may have different values than the design rules for the first plurality of features. As described herein, the print-compatible shapes may be selected from the group consisting of a rectangle, a square, a line, a circle and an oval.

The computer program may be on any kind of readable medium, and the computer-readable medium may comprise any tangible medium that can be read by a processing device configured to read the medium and execute code stored thereon or therein, such as a floppy disk, CD-ROM, magnetic tape or hard disk drive. Such code may comprise object code, source code and/or binary code.

The program or electronic representation of a circuit layout may also be configured for transmission through an appropriate medium, such as copper wire, a conventional twisted pair wireline, a conventional network cable, a conventional optical data transmission cable, or even air or a vacuum (e.g., outer space) for wireless signal transmissions. The code implementing the present program or electronic representation of a circuit layout may be digital, and are generally configured for processing by a conventional digital data processor (e.g., a microprocessor, microcontroller, or logic circuit such as a programmable gate array, programmable logic circuit/device or application-specific [integrated] circuit).

CONCLUSION/SUMMARY

Embodiments of the present invention relate to circuit layouts that are compatible with methods of forming circuits by printing electronic inks and with circuit elements formed by printing. Additional embodiments of the present invention relate to electronic circuits that include circuit elements formed using such layouts (and that may be formed by printing electronic inks) Various semiconductor, conductor, dielectric, and dopant (electronic) inks can be printed on various substrates in accordance with the present invention. Techniques for printing such electronic inks using conventional layouts can be difficult, because such features generally cannot be printed at the minimum dimensions achievable by photolithography, and inks printed in an irregular geometry and/or layout may be adversely affected by liquid-phase physical phenomena (e.g., deviations from the ideal/target pattern due to spreading, wicking along an underlying topography, beading due to surface tension effects, etc.). The development of electronics manufacturing using print-compatible circuit layouts and electronic inks, rather than the relatively wasteful, expensive and/or time-consuming conventional (photo)lithographic techniques, may result more efficient and/or less expensive production of electronic devices.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A layout for a printed circuit, comprising:
 a first layout for a first layer of the printed circuit, the first layout consisting essentially of a first plurality of features overlying a substrate corresponding to a set of first structures in the printed circuit, each of the first plurality of features overlying the substrate independently consisting essentially of a first print-compatible shape having an orientation that is either orthogonal or parallel to the orientation of every other feature in the first plurality of features; and
 a second layout for a second, printed layer of the printed circuit, the second layout consisting essentially of a second plurality of features each corresponding to a set of printed structures in the printed circuit, each of the second plurality of features independently consisting essentially of a second print-compatible shape having an orientation that is either orthogonal or parallel to the orientation of every other feature in the second plurality of features and to the orientation of every feature in the first plurality of features;
 wherein:
  a first subset of the second plurality of features cross over a first subset of the first plurality of features and overlie portions of the substrate adjacent to opposed edges of the first subset of the first plurality of features, and
  a second subset of the second plurality of features cross over a second subset of the first plurality of features and overlie portions of the substrate adjacent to opposed edges of the second subset of the first plurality of features.

2. The layout of claim 1, wherein each of the first and second print-compatible shapes is independently selected from the group consisting of a rectangle, a square, a line, a circle and an oval.

3. The layout of claim 2, wherein each of the first plurality of features consists essentially of a rectangle, square, or line having a length and a width, wherein the length and width of each of the first plurality of features is either orthogonal or parallel to the length and width of every other feature in the first plurality of features.

4. The layout of claim 3, wherein each of the second plurality of features consists essentially of a rectangle or line having a length and a width, wherein the length and width of each of the second plurality of features is either orthogonal or parallel to the length and width of every other feature in the first plurality of features and in the second plurality of features.

5. The layout of claim 3, wherein each of the first plurality of features consists essentially of the rectangle or the square, and each of the second plurality of features consists essentially of a circle having a diameter or an oval having a maximum length and a maximum width.

6. The layout of claim 5, wherein the length or width of each of the first subset of the first plurality of features is greater than the diameter and/or maximum width of each of the first subset of the second plurality of features, and the length or width of each of the second subset of the first plurality of features is greater than the diameter and/or maximum width of each of the second subset of the second plurality of features.

7. The layout of claim 1, wherein each of the second plurality of features has a length or width greater than a width of each of the first plurality of features.

8. The layout of claim 7, wherein each of the first plurality of features has a first minimum length and a first minimum width, and each of the second plurality of features has a second minimum length and a second minimum width that is equal to or greater than the first minimum length and first minimum width, respectively.

9. The layout of claim 8, wherein the first plurality of features has a first minimum inter-feature spacing, and the second plurality of features has a second inter-feature spacing equal to or greater than the first inter-feature spacing.

10. The layout of claim 9, wherein each of the first minimum length, the first minimum width, the first inter-feature spacing, the second minimum length, the second minimum width and the second inter-feature spacing is correlated to a printer grid.

11. A printed circuit, comprising:
 a first layer consisting essentially of a first plurality of structures overlying a substrate, each having a shape in a layout view consisting essentially of a first print-compatible shape, each of the first plurality of structures having an orientation that is either orthogonal or parallel to an orientation of every other structure in the first plurality of structures; and a second, printed layer consisting essentially of a second plurality of structures each having a shape in a layout view consisting essentially of a second print-compatible shape, each of the second plurality of structures having an orientation that is either orthogonal or parallel to the orientation of every other structure in the second plurality of structures and to the orientation of every structure in the first plurality of structures;

wherein:
a first subset of the second plurality of structures cross over a first subset of the first plurality of structures and overlie portions of the substrate adjacent to opposed edges of the first subset of the first plurality of structures, and a second subset of the second plurality of structures cross over a second subset of the first plurality of structures and overlie portions of the substrate adjacent to opposed edges of the second subset of the first plurality of structures.

12. The printed circuit of claim 11, wherein each of the first and second print-compatible shapes is independently selected from the group consisting of a rectangle, a square, a line, a circle and an oval.

13. The printed circuit of claim 12, wherein the first plurality of structures each consists essentially of a rectangle, square, or line having a length and a width, wherein the length and width of each of the first plurality of structures is either orthogonal or parallel to the length and width of every other structure in the first plurality of structures.

14. The printed circuit of claim 13, wherein each of the first plurality of structures consists essentially of the rectangle or the square, and each of the second plurality of structures consists essentially of a circle having a diameter or an oval having a maximum length and a maximum width.

15. The printed circuit of claim 11, wherein the length or width of each of the first subset of the first plurality of structures is greater than the diameter and/or maximum width of each of the first subset of the second plurality of structures, and the length or width of each of the second subset of the first plurality of structures is greater than the diameter and/or maximum width of each of the second subset of the second plurality of structures.

16. The printed circuit of claim 15, wherein each of the first plurality of structures has a first minimum length and a first minimum width; the first plurality of structures has a first minimum inter-structure spacing; each of the second plurality of structures has a second minimum length and a second minimum width that is equal to or greater than the first minimum length and first minimum width, respectively; and the second plurality of structures has a second inter-structure spacing equal to or greater than the first inter-structure spacing.

17. The printed circuit of claim 16, wherein each of the first minimum length, the first minimum width, the first inter-feature spacing, the second minimum length, the second minimum width and the second inter-feature spacing is correlated to a printer grid.

18. The printed circuit of claim 11, wherein the first set of structures comprise elemental silicon and/or germanium, and the second set of structures comprise a Group IVA element and/or a metal.

19. A method of printing one or more layers in an integrated circuit, comprising:

forming a first layer consisting essentially of a first plurality of structures each having a shape in a layout view consisting essentially of a first print-compatible shape, each of the first plurality of structures overlying a substrate and having an orientation that is either orthogonal or parallel to the orientation of every other structure in the first plurality of structures; and printing a second layer consisting essentially of a second plurality of structures each having a shape in a layout view consisting essentially of a second print-compatible shape, the second plurality of structures having an orientation that is either orthogonal or parallel to the orientation of every other structure in the second plurality of structures and to the orientation of every structure in the first plurality of structures;

wherein:
a first subset of the second plurality of structures cross over a first and second subset of the first plurality of structures and overlie portions of the substrate adjacent to opposed edges of the first subset of the first plurality of structures, and a second subset of the second plurality of structures cross over a second subset of the first plurality of structures and overlie portions of the substrate adjacent to opposed edges of the second subset of the first plurality of structures.

20. The method of claim 19, wherein each of the first and second print-compatible shapes is independently selected from the group consisting of a rectangle, a square, a line, a circle and an oval.

21. The method of claim 20, wherein each of the first plurality of structures consists essentially of a rectangle, square, or line having a length and a width, and each of the second plurality of structures consists essentially of a rectangle or line having a length and a width, wherein the length and width of each of the first plurality of structures is either orthogonal or parallel to the length and width of every other structure in the first plurality of structures, and the length and width of each of the second plurality of structures is either orthogonal or parallel to the orientation of every other structure in the first plurality of structures and in the second plurality of structures.

22. The method of claim 20, wherein the first plurality of structures each consist essentially of the rectangle or the square, and the second plurality of structures each consist essentially of a circle having a diameter or an oval having a maximum length and a maximum width, wherein the length or width of each of the first subset of the first plurality of structures is greater than the diameter and/or maximum width of each of the first subset of the second plurality of structures, and the length or width of each of the second subset of the first plurality of structures is greater than the diameter and/or maximum width of each of the second subset of the second plurality of structures.

23. The method of claim 19, wherein each of the first plurality of structures has a first minimum length and a first minimum width; the first plurality of structures has a first minimum inter-structure spacing; each of the second plurality of structures has a second minimum length and a second minimum width; the second plurality of structures has a second inter-structure spacing; the second minimum length and the second minimum width are greater than or equal to the first minimum length and the first minimum width, respectively; and the second inter-structure spacing is equal to or greater than the first inter-structure spacing.

24. The method of claim 23, wherein each of the first minimum length, the first minimum width, the first inter-structure spacing, the second minimum length, the second minimum width and the second inter-structure spacing is correlated to a printer grid.

25. The method of claim 19, wherein printing the second layer comprises printing an ink composition comprising one or more semiconductor and/or metal precursors onto or over the first layer.

26. The method of claim 25, wherein forming the first layer comprises printing an electronic ink composition onto a substrate.

* * * * *